United States Patent [19]

Bailey

[11] Patent Number: 5,418,086
[45] Date of Patent: May 23, 1995

[54] BATTERY WITH COULOMETRIC STATE OF CHARGE INDICATOR

[75] Inventor: John C. Bailey, Columbia Station, Ohio

[73] Assignee: Eveready Battery Company, Inc., St. Louis, Mo.

[21] Appl. No.: 103,019

[22] Filed: Aug. 9, 1993

[51] Int. Cl.⁶ .............. H01M 10/48; H01M 6/18; H01M 4/36
[52] U.S. Cl. ................. 429/93; 429/91; 429/162; 429/191; 429/192; 429/219; 429/220
[58] Field of Search ........ 429/91, 92, 93, 191, 429/162, 163, 219, 192, 220

[56] References Cited

U.S. PATENT DOCUMENTS

| | | | |
|---|---|---|---|
| 3,773,563 | 11/1973 | Eaton, Jr. et al. | 429/91 |
| 4,025,700 | 5/1977 | Fagen, Jr. et al. | 429/91 |
| 4,388,380 | 6/1983 | DeHaan et al. | 429/91 |
| 4,416,957 | 11/1983 | Goebel et al. | 429/91 |
| 4,581,305 | 4/1986 | Jones et al. | 429/91 |
| 4,702,563 | 10/1987 | Parker | 350/351 |
| 4,702,564 | 10/1987 | Parker | 350/351 |
| 4,737,020 | 4/1988 | Parker | 350/351 |
| 4,835,475 | 5/1989 | Hanakura et al. | 324/435 |
| 5,015,544 | 5/1991 | Burroughs et al. | 429/93 |
| 5,059,895 | 10/1991 | Cataldi et al. | 324/104 |
| 5,156,931 | 10/1993 | Burroughs et al. | 429/93 |
| 5,188,231 | 2/1993 | Kivell et al. | 206/333 |

FOREIGN PATENT DOCUMENTS

| | | |
|---|---|---|
| 0523901 | 1/1993 | European Pat. Off. |
| 63-213256 | 9/1988 | Japan. |
| 93-06474 | 4/1993 | WIPO. |

OTHER PUBLICATIONS

R. R. Secunde and A. G. Birchenough, NASA Technical Note NASA TND-5773, National Aeronautics and Space Admin. Washington, D.C., Jul. 1970.

J. H. Kennedy and F. Chen, J. Electrochem. Soc., 118, 1043, (p. 84), 1971 (no month).

*Primary Examiner*—John S. Maples
*Attorney, Agent, or Firm*—Robert W. Welsh

[57] ABSTRACT

A thin film coulometer for use as a battery state of charge indicator in which the indicator is located on a battery and connected in parallel across a current path of a resistive segment of the battery so that during discharge, the coulometer can be observed to indicate the capacity of the battery. The coulometric charge indicator device may have a variable thickness construction and include indicia which are produced upon battery discharge.

20 Claims, 2 Drawing Sheets

BATTERY WITH COULOMETRIC STATE OF CHARGE INDICATOR

FIELD OF THE INVENTION

The invention relates to a battery containing a coulometric charge indicator device to display the capacity of the battery during discharge.

BACKGROUND OF THE INVENTION

Batteries are generally stored for various periods of time before being put into use. The batteries can be stored by the seller and frequently when purchased they are again stored by the buyer prior to being put to use. It is therefore desired to have some sort of testing means for determining if a battery has been partially discharged and thus may not have sufficient charge to operate a desired device. Initially, separate battery testers were developed which could measure the strength remaining in the battery. Recently battery testers have been developed that either are included in the battery package or assembled in the label secured to the battery. The testers generally indicate the capacity remaining in the battery.

U.S. Pat. No. 4,702,564 discloses a device for testing a battery, particularly a small, portable battery, comprising a flexible, transparent substrate on which is deposited a narrow band of a black light-absorbing material. A conductive material, which may taper outwardly in opposite directions from a central point to a pair of outer terminals, is then deposited atop the substrate on the same side of the substrate as the absorber layer or on the opposite side of the substrate as the absorber layer. A layer of a cholesteric liquid crystal material is then deposited on the substrate on the opposite side from the black absorber layer or over the absorber layer. The conductive material is an epoxy cement-based conductor, preferably silver, printed or painted directly on the substrate. An indicator scale is located along sections of the conductive material. To test a dry cell battery, the terminal ends of the conductive material are placed in contact with the battery terminals, causing a current to flow which heats the conductive material, the heat generated being the most intense at the central point and radiating outwardly. The heat is transferred through the thin substrate to the liquid crystal layer which results in a color change in the liquid crystal. The traverse of the color change along the length of the indicator scale, outwardly from the center point, is proportional to the current or voltage output or the condition of the battery to be tested and can be read on the indicator scale which is calibrated accordingly. The tester also includes means for determining the amp-hours or life of a battery.

U.S. Pat. No. 5,015,544 discloses a battery strength indicating and switch means on a battery which is coupled across the terminals of the battery and which is provided with an indicating means to indicate the strength of the battery and in addition, the battery strength indicating means is also provided with an in-line switch which can easily be depressed to complete the circuit so as to place the indicator means across the terminals of the cell and display the charge of the battery.

U.S. Pat. No. 5,059,895 discloses a battery voltmeter comprising:

(A) a dielectric layer;
(B) a conductive layer above or below one of the surfaces of the dielectric layer; and
(C) a temperature sensitive color indicator layer in thermal contact with the conductive layer, characterized in that the conductive layer has (i) thermal insulating means under one of its surfaces and (ii) sufficient heat generating capacity to affect a change in the temperature sensitive color indicator layer. The voltmeter can be integrated into a label and attached directly to a battery.

U.S. Pat. No. 4,835,475 discloses an apparatus for indicating the electromotive force of a dry battery which comprises:

(i) a film base;
(ii) an electrically conductive layer disposed on one side of the film base,
(iii) a protective layer disposed on the electrically conductive layer, and
(iv) a thermochromic layer disposed on the other side of the film base.

Japanese Kokai Patent, SHO 63-213256 discloses a battery equipped with a color timer in which a sensor that changes color with time is placed on a battery so that capacity consumed can be displayed.

In the NASA Technical Note NASA TN D-5773, National Aeronautics and Space Administration, Washington, D.C. July 1970, an article by Richard S. Secunde and Arthur G. Birchenough discloses a mercury electrochemical coulomer as a battery charge indicator. Specifically, use of a mercury-column electrochemical coulometer is discussed as a means of indicating the state of charge of secondary batteries. A state-of-charge indicator was designed, built in breadboard form, and tested. The coulometer is the element which integrates the ampere-hours into and out of the battery. The state of charge then is the difference between the known fully charged battery capacity and the net ampere-hours removed. The general nonlinear charge-discharge characteristics of a battery were matched through the use of operational-amplifier techniques. The results of electrical and temperature tests on the breadboard of the indicator demonstrate that the mercury-column coulometer is a feasible device around which a battery state-of-charge indicator suitable for space power systems, or other uses, might be built.

Other types of label charge indicating devices have been disclosed in the art.

An object of the present invention is to provide a battery with a coulometric charge indicator device that can be used to indicate the capacity of the battery during discharge.

Another object of the present invention is to provide a battery with a coulometric charge indicator device that is cost effective to produce and reliable to use.

Another object is to provide a battery tester label for a battery containing a coulometric charge indicator device.

DESCRIPTION OF THE INVENTION

The invention relates to an electrochemical cell housed in a container and having a coulometric charge indicator device, said coulometric charge indicator device comprising a first electrode capable of being electrochemically dissolved, an electrolyte disposed in contact with said first electrode and a second electrode in contact with said electrolyte and being capable of receiving the dissolved first electrode; said coulometric charge indicator device connected in parallel across a current path of a resistive segment of said cell so that when the cell is discharged a current will flow through the resistive segment thereby providing a voltage across the coulometric charge indicator device so that said first electrode will dissolve and be transported through the electrolyte and deposited on the second electrode where the amount of the first electrode deposited on the second electrode can be used to indicate the capacity of the battery.

As used herein the term deposited on the second electrode also includes those cases where the first electrode will at least be partially absorbed into the second electrode.

A coulometer is an electrolytic cell used for the measurement of the quantity of electricity passing through a circuit. A conventional type of coulometer would use copper electrodes in a bath of copper sulfate. With a voltage applied across the electrodes, copper will dissolve from one electrode and be deposited on the other electrode. The amount of copper deposited on the other electrode would be proportional to the quantity of electricity in coulombs passing through the circuit. In accordance with this invention, this deposited copper can be used to indicate the capacity of the cell.

In the subject invention, a thin film coulometer construction is located on the cell and positioned to be connected in parallel across a current path of a resistive segment of the cell so that when the cell is discharged, a voltage will be applied across the coulometric charge indicator device. Since the coulometer is driven by the voltage drop across the discharge circuit of the resistance segment of the cell, only a small part of the current flows through the coulometer. The coulometer can be configured as either a parallel plate construction or as spaced-apart plates in a common plane. In either embodiment a switch is not required. The capacity removed from the cell can be determined, in the case of a copper coulometer, by observing the deposit of the copper on a parallel plate construction or by observing the position of the electrolyte in an in-plane plate construction. In each construction, a suitable readout scale could be used with the coulometer. The coulometer can display the remaining capacity of the cell from actual discharge of the cell but will not show capacity loss from corrosion or any non-discharge means.

Normally, a coulometer is connected in series so that all the current being measured passes through the coulometer. In the case of a coulometer-based battery state of charge indicator, the coulometer must be capable of passing the high currents which can be delivered by a cell, yet causing negligble voltage drop. Ideally, the coulometer should have a lower impedance than the cell. A low impedance coulometer capable of carrying the large currents delivered by a cell would probably require large electrode areas. These requirements are contrary to the desire to make a small inexpensive state of charge monitoring device which can be attached to a cell, for example, as part of the cell label. To overcome these disadvantages, it has been discovered that a thin film coulometer can be connected in parallel across a current path of a resistive segment of the cell so that only a small amount of current will be drawn by the coulometer. In this novel construction, the coulometer is driven by the small voltage drop across the cell's resistive segment. Preferably the voltage drop across the resistive segment can be about 0.2 volt or lower and more preferably about 0.01 volt or lower. For most applications, the resistive segment should be a fraction of the intended cell load. For example, in a cell used on a 150-ohm drain, a resistive segment of 1.5 ohm would be acceptable whereby a resistive segment of 0.04 ohm would be suitable for a 3.9-ohm high rate discharge. Generally, a resistive segment of 0.01 to 1000 ohms would be suitable for most applications.

Generally, the voltage drop across the resistive segment should be 4% of the voltage of the cell or lower. Preferably, the anodic and cathodic reactions of the coulometer should be of equal electrochemical potential and have low overpotentials. A thin film coulometer is ideal for this application. Preferably, a thin film coulometer should be about 0.020 inch thick or less, more preferably about 0.005 inch thick or less and most preferably about 0.003 inch thick or less. In the in-plane thin layer construction, the thickness of the coulometer would preferably be within the thinner range.

Mercury coulometers use a liquid electrolyte and metallic mercury both of which make the system difficult to manufacture and unsuitable for use in a consumer product. Thin gold/solid electrolyte/silver coulometers are not suitable for battery state of charge indicators because they cannot be read visually and generally can only be read at their full capacity.

Suitable materials for the first electrode of the coulometer of this invention are copper, nickel, silver bismuth, tin, zinc and gold with copper being the preferred. Suitable electrolytes would be aqueous solutions of gels containing soluble salts such as nitrates, sulfates or halides of the electrode material and solid electrolytes such as ionically conductive polymers, solid state inorganic materials and organic-inorganic composites with polymeric electrolytes being the preferred. The polymeric electrolytes may include water or lower molecular weight plasticizers such as organic solvents. Examples of polymeric resins suitable for electrolyte manufacture include polyvinyl alcohol, polyethylene oxide, polymerized hydroxyethyl cellulose and poly(2-acrylamido-2-methyl-1-propane sulfonic acid). In some applications, a supporting electrolyte may be used. Polyethylene oxide containing copper ions such as copper sulfate, and silver nitrate plus PEO are the preferred electrolytes for this invention.

Preferably the second electrode should be a transparent or translucent electrode so that the deposited material from the first electrode can be visually observed. In the in-plane construction, the second electrode need not be transparent or translucent since the movement of the electrolyte between the electrodes can be used to indicate the capacity of the cell. The preferred coulometer for use in this invention would employ a copper foil as the first electrode, an ionically conductive polymer electrolyte, such as polyethylene oxide containing copper ions, and a second electrode of indium tin oxide. The materials for the first electrode could also be used for the second electrode in some applications.

BRIEF DESCRIPTION OF THE DRAWINGS

In FIG. 1, a thin film coulometric charge indicator device 2 is shown comprising an electrode 4 of copper foil or a printed copper ink, a polymer electrolyte 6, an optically transparent electrode 8 and a top layer of plastic film 10. The top layer of plastic film 10 could be the label for the cell so that the coulometer 2 would be connected in parallel across a resistive segment of the cell, such as a copper foil section, a silver printed layer or a component of the cell such as a tab or connector. Upon being discharged, the current through the resistive segment of the cell would put a voltage across the coulometer 2 which will cause the copper electrode 4 to dissolve, be transported through the electrolyte 6 and be deposited on the optically transparent electrode 8. The amount of copper deposited on optically transparent electrode 8 can then be used to indicate the capacity of the cell.

FIG. 2 shows a similar type coulometer 20 comprising an electrode 22 of copper foil or printed copper ink, electrolyte 24, optically transparent electrode 26 and top plastic film 28. The electrolyte 24 is constructed with a variable thickness so that the rate of dissolution of copper electrode 22 and deposition of copper on electrode 26 is faster at the thinner portions of the coulometer. This effect can be achieved by printing the electrolyte layers in different thicknesses or by embossing the copper foil. The embossed areas of the electrode will provide one or more cavities so that the electrolyte layer will be thicker in such cavities. This feature can be used to produce an appropriate predesigned indicia such as a digital or alphanumeric display, e.g., a message recording the state of cell discharge could be provided by the remaining undissolved portions of electrode 22.

FIG. 3 shows a similar type coulometer 30 comprising copper foil electrode 32, electrolyte 34, optically transparent electrode 36 and top plastic film 38. The electrolyte 34 is constructed with a stepped thickness so that a more accurate determination of the amount of charge passed can be made since the rate of copper deposition will be inversely proportional to the electrolyte thickness. Alternatively, electrode 32 could be provided in different thicknesses, conveniently by printing a copper ink, such that the thicker portions spell out a message to the consumer, which thicker portions are readily visible as the surrounding thinner areas are consumed by dissolution.

FIG. 4 shows a coulometer 40 comprising a printed conductive ink electrode layer 42, such as copper, silver, carbon or the like, a printed polymer electrolyte 44, a sputtered or vapor deposited copper electrode layer 46 and top plastic layer 48. When a voltage is placed across coulometer 40, the copper layer 46 will dissolve and be deposited on an electrode layer 42. By observing the disappearance of copper layer 46, the amount of discharge of the cell can be judged from the color of layer 46. This visual change can be enhanced by providing electrolyte 44 with a contrasting color through the use of a dye or pigment. Additionally, copper layer 46 could conceal a suitable message to the consumer contained in or on the electrolyte layer or counter electrode layer, which message becomes visible as the electrode layer 46 is dissolved.

FIG. 5 shows a coulometer 50 comprising a plastic substrate 52, electrode 54 spaced apart from and in line with electrode 56 and having an electrolyte 58 disposed in the space 60 defined by the spaced apart electrodes 54 and 56. Preferably, the electrodes 54 and 56 are made of copper. A protective insulating layer 62 is placed on top of electrodes 54 and 56 so that with plastic substrate 52, the electrolyte 58 is confined to the space 60 between electrodes 54 and 56. Area 64 of electrode 54 can be electronically connected to one end of a resistance segment on the cell while area 66 of electrode 56 can be electronically connected to the opposite end of the resistive segment on the cell. In this embodiment, copper ions are stripped from one electrode and carried to the opposite electrode by the narrow width electrolyte and thus, the position of the electrolyte can be observed and used to indicate the capacity of the cell.

FIG. 6 is a schematic circuit including a cell 70 having positive and negative electrodes and a resistive area 72 (shunt resistance). The resistive area is any resistive segment of the cell through which current will pass when the cell is being discharged. Connected in parallel across resistive area 72 is coulometer 74 of the type shown in FIG. 5 using copper electrodes. Connected across the cell 70 is a resistive load 76, such as a light bulb, radio or the like. When the cell is discharging, current flows through resistive segment 72 and places a voltage across coulometer 74. Copper from one electrode will dissolve and be deposited on the other electrode thereby moving the electrolyte as discussed with reference to FIG. 5. The new location of the electrolyte can then be used to indicate the capacity of the cell. As stated above, a suitable readout scale can be used in conjunction with the coulometers of this invention to provide a visual readout of the capacity of the cell.

Figure 1:
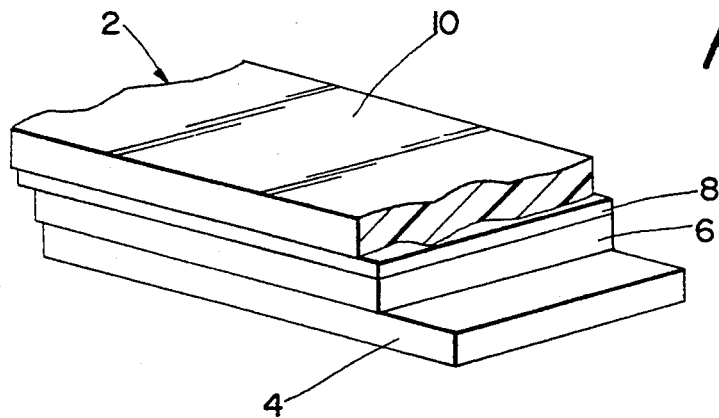
FIG. 1 is a perspective view of a thin film coulometric charge indicator device of this invention.
Figure 2:
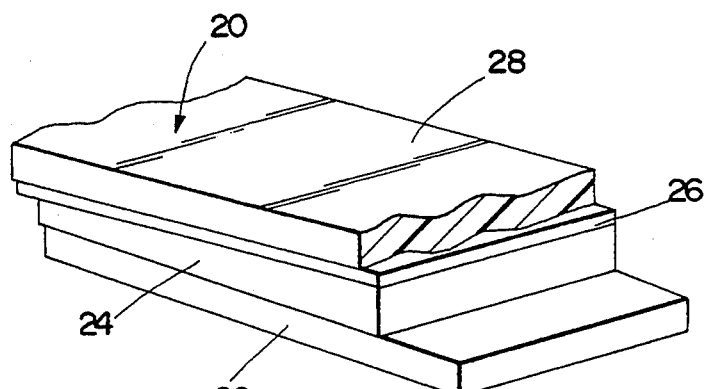
FIG. 2 is a perspective view of another thin film coulometric charge indicator device of this invention employing an electrolyte of variable thickness.
Figure 3:
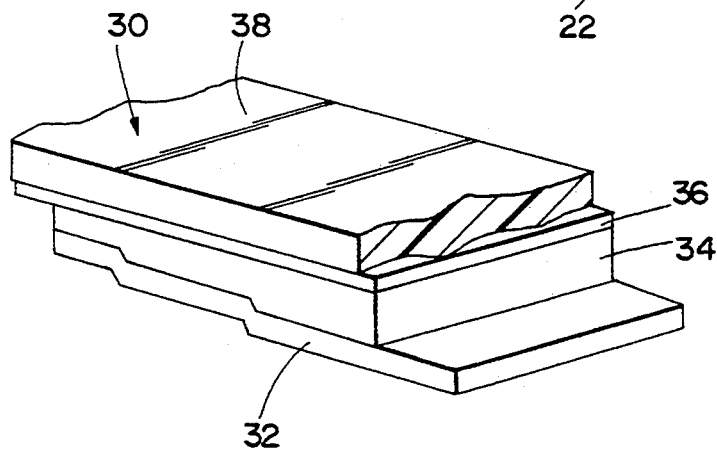
FIG. 3 is a perspective of another thin film coulometric charge indicator device of this invention employing an electrolyte with a stepped construction.
Figure 4:
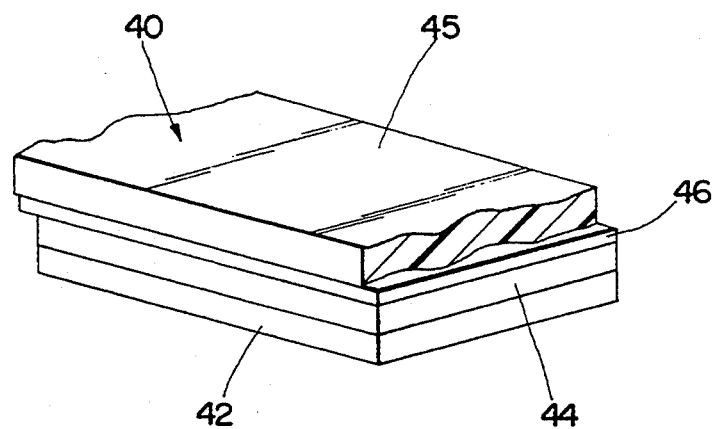
FIG. 4 is a perspective view of another thin film coulometric charge indicator device of this invention.
Figure 5:
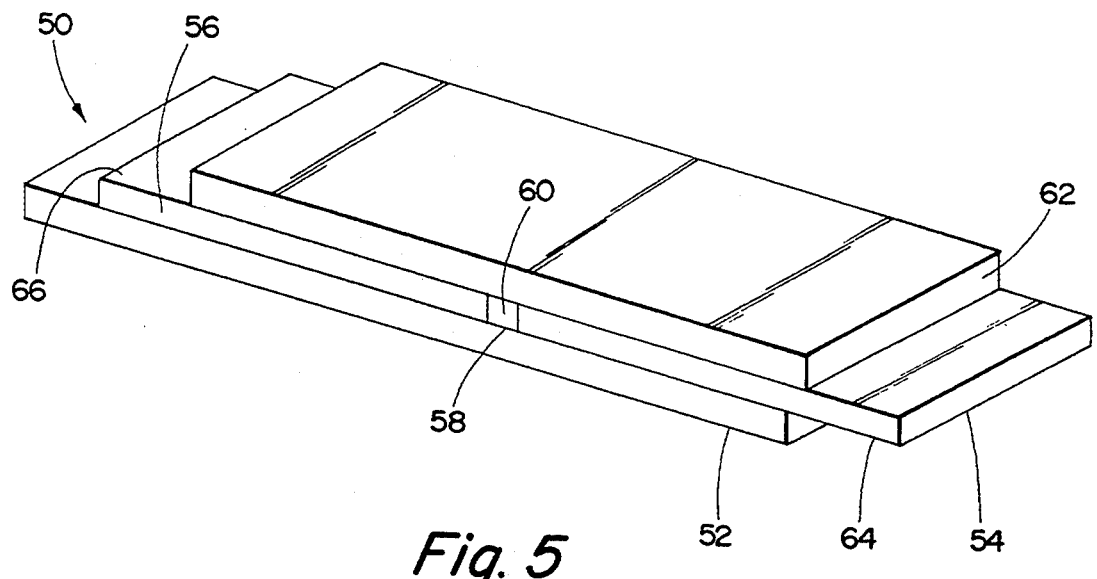
FIG. 5 is a perspective view of an in-plane construction of a thin film coulometric charge indicator device of this invention.
Figure 6:
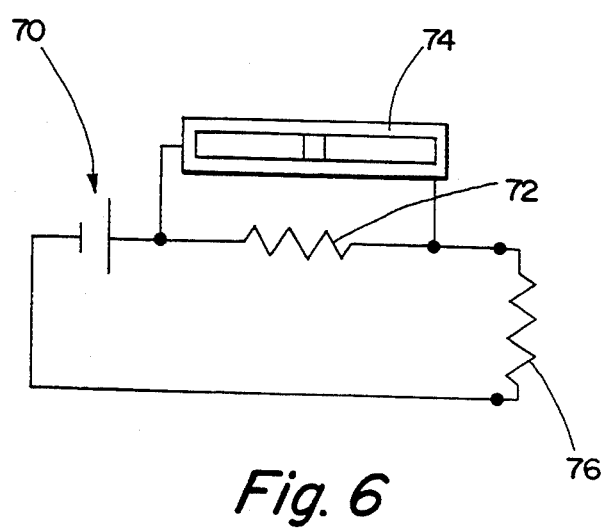
FIG. 6 is a schematic view of the circuitry for a thin film coulometric charge indicator device of this invention assembled on a cell coupled to a load.

It will be understood that various changes in the details, materials and arrangements of parts of the coulometer which have been described herein may be made by those skilled in the art within the principle and scope of the inventions as expressed in the claims.

What is claimed is:

1. An electrochemical cell housed in a container and having a coulometric charge indicator device, said coulometric charge indicator device comprising a first electrode capable of being electrochemically dissolved, an electrolyte disposed in contact with said first electrode and a second electrode in contact with said electrolyte and being capable of receiving the dissolved first electrode; said coulometric charge indicator device connected in parallel across a current path of a resistive segment of said cell so that when the cell is being discharged a current will flow through the resistive segment thereby providing a voltage across the coulometric charge indicator device so that said first electrode will dissolve and be transported through the electrolyte and deposited on the second electrode and wherein the amount of the first electrode deposited on the second electrode can be used to indicate the capacity of the cell.

2. The electrochemical cell of claim 1 wherein the second electrode is superimposed over the electrolyte and first electrode.

3. The electrochemical cell of claim 1 wherein the first and second electrodes are spaced apart in the same plane and the electrolyte is disposed in the space defined by the first electrode and second electrode.

4. The electrochemical cell of claim 2 wherein the electrolyte has a variable thickness construction.

5. The electrochemical cell of claim 2 wherein the electrolyte has a stepped-shape construction.

6. The electrochemical cell of claim 2 wherein the coulometric charge indicator device is 0.020 inch in thickness or less.

7. The electrochemical cell of claim 3 wherein the coulometric charge indicator device is 0.005 inch in thickness or less.

8. The electrochemical cell of claim 4 wherein the variable thickness of the electrolyte is designed such that upon discharge an indicia is produced on the coulometric charge indicator device.

9. The electrochemical cell of claim 1 wherein the first electrode is embossed to provide (1) at least one cavity containing at least a first portion of electrolyte and (2) a region adjacent the cavity proximate to a second portion of electrolyte so that the first portion of electrolyte in said at least one cavity will be thicker than the second portion of electrolyte disposed in the region adjacent the cavity so that upon discharge, a predesigned indicia is produced on the coulometric charge indicator device.

10. The electrochemical cell of claim 1 wherein the resistive segment is from about 0.01 to 1000 ohms.

11. The electrochemical cell of claim 1 wherein the first electrode is selected from the group consisting of copper, nickel, silver, bismuth, tin, zinc and gold and the second electrode is selected from the group consisting of copper, nickel, silver, bismuth, tin, zinc and gold.

12. The electrochemical cell of claim 1 wherein the electrolyte is selected from the group consisting of ionically conductive polymers, solid state inorganic materials and organic-inorganic composites.

13. The electrochemical cell of claim 11 wherein the electrolyte is selected from the group consisting of ionically conductive polymers, solid state inorganic materials and organic-inorganic composites.

14. The electrochemical cell of claim 1 wherein the first electrode is copper, the second electrode is copper, and the electrolyte is polyethylene oxide containing copper ions.

15. The electrochemical cell of claim 11 wherein the first electrode is silver, the second electrode is silver and the electrolyte comprises silver nitrate.

16. The electrochemical cell of claim 1 wherein a plastic film is disposed over the coulometer and wherein said plastic film functions as the label for the cell.

17. The electrochemical cell of claim 1 wherein a readout scale is used with the coulometer so that the remaining capacity of the cell can be observed during cell discharge.

18. The electrochemical cell of claim 17 wherein a plastic film is disposed over the coulometer and wherein said plastic film functions as the label for the cell.

19. The electrochemical cell of claim 18 wherein the first electrode is silver, the second electrode is silver and the electrolyte comprises silver nitrate.

20. The electrochemical cell of claim 18 wherein the first electrode is copper, the second electrode is copper and the electrolyte is polyethylene oxide containing copper ions.

* * * * *